310-334

8/16/83

XR 4,398,325

SR

United States Patent [19]

Piaget et al.

[11] 4,398,325

[45] Aug. 16, 1983

[54] PROCESS FOR PRODUCING ULTRASONIC TRANSDUCERS HAVING COMPLEX SHAPES

[75] Inventors: Bernard Piaget, Venon; Jean-François Piquard, Vizille, both of France

[73] Assignee: Commissariat a l'Energie Atomique, Paris, France

[21] Appl. No.: 272,095

[22] Filed: Jun. 10, 1981

[30] Foreign Application Priority Data

Jun. 25, 1980 [FR] France ................................ 80 14101

[51] Int. Cl.[3] ............................................ H01L 41/22

[52] U.S. Cl. .................................. 29/25.35; 310/334; 310/368

[58] Field of Search ............... 29/25.35; 310/367-369, 310/334, 336, 337

[56] References Cited

U.S. PATENT DOCUMENTS 3,496,617 2/1970 Cook et al. ......................... 29/25.35
4,305,014 12/1981 Borburgh et al. .............. 310/368 X

FOREIGN PATENT DOCUMENTS 54-149615 11/1979 Japan ................................. 29/25.35

OTHER PUBLICATIONS

Ultrasonics; Nov. 1974; p. 235.

*Primary Examiner*—Carl E. Hall
*Attorney, Agent, or Firm*—Oblon, Fisher, Spivak, McClelland & Maier

[57] ABSTRACT

Process for producing complex ultrasonic transducers comprising cutting out a piezoelectric ceramic block along lines which are parallel to one another by means of at least two rows of channels making it possible to produce elementary transducers and selecting the cut elements so as to obtain the desired complex transducer shape, wherein the selected elements are electrically interconnected by one of their faces by means of a conductive deposit and the other face of said elements is raised to reference potential.

Application to the production of ring grating or annular transducers.

10 Claims, 4 Drawing Figures

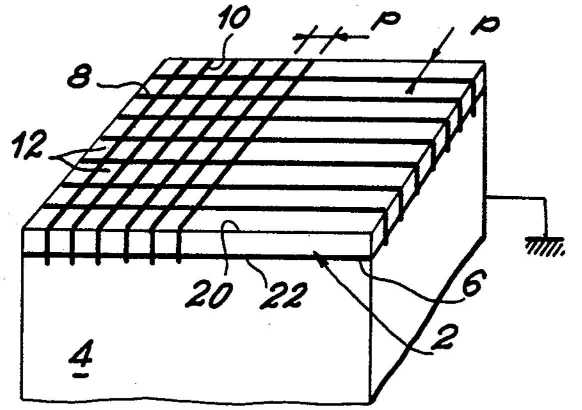
FIG.1
FIG.2
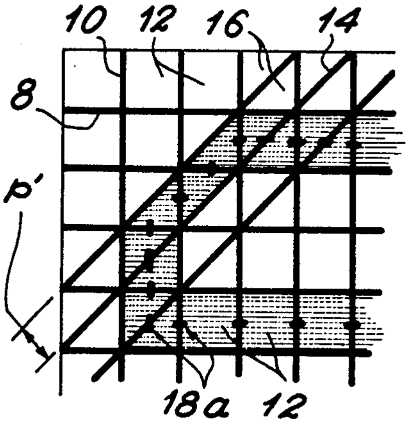
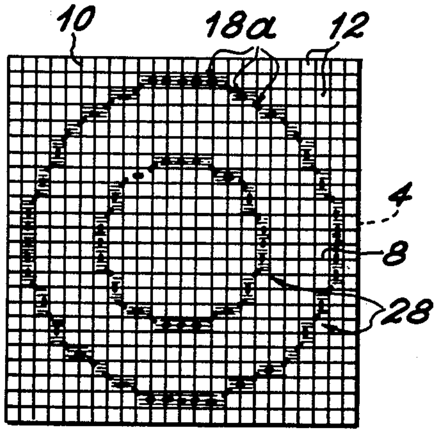
FIG.4
FIG.3
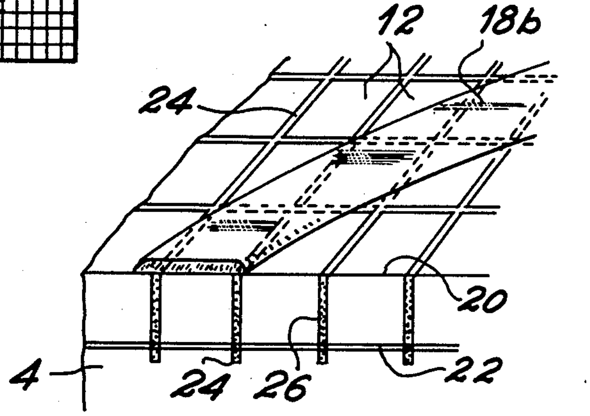

PROCESS FOR PRODUCING ULTRASONIC TRANSDUCERS HAVING COMPLEX SHAPES

BACKGROUND OF THE INVENTION

The present invention relates to a process for producing ultrasonic transducers having complex shapes and is applicable to obtaining annular transducers.

More specifically, the invention relates to a process for producing complex piezoelectric transducers formed from a plurality of elementary transducers which can have varied shapes and obtained by cutting from a piezoelectric ceramic block. These transducers are more particularly used in medical echography processes.

When the elementary transducers are applied to the patient's skin, they transmit ultrasonic waves, which are propagated in the tissues and are reflected on an obstacle or interface. The echos or reflected waves coming from these interfaces reach the transducers used, then serving as receivers, with a time lag compared with transmission and which is dependent on the distance between the transducer and the reflecting surface. When the time required for an outward and return travel has elapsed, a new pulse can be transmitted. The echos can then be displayed on an oscilloscope screen.

Transducers with complex shapes and in particular ring grating transducers using echo tracking focusing are already known. This focusing of the received wave at a point located on the transmitted wave front makes it possible to obtain a good resolving power for two echo points located on the "firing line". Such transducers are described in the article which appeared in Acta Electronica of 22.2.1979, pp. 119 to 127 and entitled "Echo tracking focusing ring grating transducers". Such ring grating or annular transducers are constructed from a plurality of square elementary transducers electrically connected to an electronic switching device making it possible to group said elementary transducers in the form of concentric circles. As these annular transducers do not have a predetermined shape, it is necessary to use an extremely complex switching device, both from the construction and from the operational standpoints.

BRIEF SUMMARY OF THE INVENTION

The present invention relates to a process for the production of transducers having complex shapes and which in particular makes it possible to produce annular transducers having a predetermined shape and a simpler construction than those of the prior art, because they require no electronic switching device.

In addition, the construction of complex transducers of random shapes also comes up against serious problems in connection with the machining of the ceramic block.

The invention makes it possible to solve these machining problems.

The process for the production of complex ultrasonic transducers consists of cutting a piezoelectric ceramic block along paths which are parallel to one another by means of at least two series of second channels, which makes it possible to produce elementary transducers and select the cut elements in such a way as to obtain the desired complex shape of the transducers. This is brought about by electrically interconnecting the selected elements by one of their faces using a conductive deposit and raising the other face of said elements to reference potential.

According to a preferred embodiment of the invention, the two series of channels are located at 90° of one another, the elementary transducers having a square shape.

According to another embodiment of the invention, a third series of channels is formed in the ceramic block which is at an angle of 45° to the other two series of channels, thus making it possible to produce triangular elementary transducers.

According to a preferred embodiment of the invention, the entire thickness of the ceramic block is cut out so as to mechanically insulate each element.

According to another preferred embodiment of the invention, the conductive deposit is deposited in the form of short lines or dashes and is preferably produced by masking.

This process for the production of transducers with complex shapes by multiple cutting operations makes it possible to obtain inter alia, annular transducers.

BRIEF DESCRIPTION OF THE DRAWINGS

The invention is described in greater detail hereinafter relative to non-limitative embodiments and with reference to the attached drawings, wherein show:

FIG. 1 diagrammatically, cutting out a ceramic block in the form of elementary transducers according to the invention.

FIG. 2 diagrammatically and according to a first embodiment, the electrical assembly of the various elementary transducers.

FIG. 3 diagrammatically and according to a second embodiment, the electrical assembly of the various elementary transducers.

FIG. 4 diagrammatically, an application of the process according to the invention.

DETAILED DESCRIPTION OF THE PREFERRED EMBODIMENTS

FIG. 1 shows a piezoelectric ceramic block 2 in the shape of a square based parallelepiped glued to a conductive support 4 by means of a conductive glue 6. This conductive support 4, which is connected to reference potential can, for example, be made from lead. The ceramic block 2 is then cut out by means of diamond saws or smooth wire saws in the form of lines which are also parallel to one another and have a constant pitch with the aid of two rows of channels 8 and 10 at 90° of one another, thus making it possible to obtain square elementary transducers 12.

A third row of channels 14, shown in FIG. 2, can then be cut from ceramic block 2. This third row of channels 14 is at an angle of 45° to the two other rows of channels 8 and 10, thus making it possible to produce triangular elementary transducers 16, as is diagrammatically shown in FIG. 2.

The two rows of channels 8 and 10 have the same pitch p in order to obtain square elementary transducers 12, whilst the third row of channels 14 has a different pitch p′ in FIG. 2, so as to obtain triangular elementary transducers 16. Obviously, the two rows of channels could have a relative angle other than 90° and the third row of channels could have an angle differing from 45°. This would make it possible to obtain other elementary transducer shapes.

The elementary transducers 12 or 16 must be completely cut out in such a way that the various elements are mechanically insulated from one another. It should be noted in this connection that the thickness of conductive support 4 must be such that it cannot be completely cut out during the cutting of ceramic block 2.

The thus cut elementary transducers 12 or 16 are then selected, in the manner shown by shading in FIG. 2 so as to provide the desired complex transducer shape. The selected elements are then electrically interconnected by one of their faces, said face being in the present case upper face 20 of said elements 12 or 16. For this purpose, a conductive deposit 18 is used and is deposited by means of a junction mask on elementary transducers 12 or 16 either in the form of the short lines or dashes 18*a* shown in FIG. 2 or in the form of a strip 18*b* shown in FIG. 3.

Conductive deposit 18 can either be obtained by vacuum metallization or by means of a silver based varnish. Conductive deposit 18 makes it possible to electrically connect the upper faces 20 for elementary transducers 12 or 16. The lower faces 22 of said transducers are in contact via conductive glue 6 with the conductive support 4 and are raised to the reference potential. Moreover, the channel spaces 24 between two consecutive transducer elements are filled with a resin 26 having a high acoustic impedance.

This process for producing complex ultrasonic transducers makes it possible in particular to obtain annular transducers 28 of the type shown in FIG. 4. The selected elementary transducers 12 (shaded) are electrically connected by means of a conductive deposit 18 in the form of dashes 18*a*. Such a device can be used in medical echography using echo tracking focusing as described in the prior art article entitled "Echo tracking focusing ring grating transducers".

What is claimed is:

1. A process for producing complex ultrasonic transducers comprising the steps of:
   - glueing by means of a conductive glue a pizoelectric ceramic block to a conductive support which conductive support is connected to a reference potential;
   - cutting at least two rows of channels into said ceramic block each row of channels being cut along lines which are parallel to one another such that the channels of each row intersect the channels of at least another row to produce elementary transducers and whereby the entire thickness of the ceramic block is cut through in order to mechanically insulate each produced elementary transducer;
   - selecting from among the produced elementary transducers obtained by cutting in order to obtain a desired complex transducer shape;
   - electrically interconnecting the selected elements by one of their faces by means of a conductive deposit; and
   - raising the other face of said elements to a reference potential.

2. The process according to claim 1 wherein said complex ultrasonic transducers are annular ultrasonic transducers.

3. A process according to claim 1, wherein the two rows of channels are at an angle of 90° from one another, the elementary transducers having a square shape.

4. A production process according to claim 2, wherein a third row of channels is formed in the ceramic block which is at an angle of 45° with the two other rows of channels, thus making it possible to produce elementary transducers having a triangular shape.

5. A production process according to claim 1, wherein the channel space between two consecutive elements is filled by means of a resin having a high acoustic impedance.

6. A production process according to claim 1, wherein the conductive deposit is deposited in the form of a strip.

7. A production process according to claim 1, wherein the conductive deposit is deposited in the form of short lines.

8. A production process according to claim 1, wherein the conductive deposit is produced by masking.

9. A production process according to claim 1, wherein the conductive deposit is obtained by vacuum metallization.

10. A production process according to claim 1, wherein the conductive deposit is obtained by means of a silver based varnish.

* * * * *